US010636954B1

United States Patent
Ho et al.

(10) Patent No.: US 10,636,954 B1
(45) Date of Patent: Apr. 28, 2020

(54) THERMOELECTRIC COOLER (TEC) HAVING TOP AND BOTTOM PLATES WITH ASYMMETRIC THERMAL CONDUCTIVITY AND AN OPTICAL SUBASSEMBLY IMPLEMENTING THE SAME

(71) Applicant: Applied Optoelectronics, Inc., Sugar Land, TX (US)

(72) Inventors: I-Lung Ho, Sugar Land, TX (US); Qin Li, Houston, TX (US); Chong Wang, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/506,491

(22) Filed: Jul. 9, 2019

(51) Int. Cl.
| H04B 10/00 | (2013.01) |
| H01L 35/32 | (2006.01) |
| H04B 10/50 | (2013.01) |
| H01S 5/068 | (2006.01) |
| F25B 21/02 | (2006.01) |
| H04J 14/00 | (2006.01) |

(52) U.S. Cl.
CPC .............. *H01L 35/32* (2013.01); *F25B 21/02* (2013.01); *H01S 5/06804* (2013.01); *H04B 10/501* (2013.01)

(58) Field of Classification Search
CPC ..... H01L 33/64; G02B 6/0085; G02B 6/3814; H04B 10/50; H04B 10/501
See application file for complete search history.

(56) References Cited

U.S. PATENT DOCUMENTS

| 9,869,494 B1 * | 1/2018 | Campbell | ............... F25B 21/02 |
| 2003/0095736 A1 * | 5/2003 | Kish, Jr. | ................ B82Y 20/00 385/14 |
| 2008/0187325 A1 * | 8/2008 | McCallion | ........... G02B 6/4201 398/192 |

\* cited by examiner

*Primary Examiner* — Daniel G Dobson
(74) *Attorney, Agent, or Firm* — Grossman Tucker Perreault & Pfleger, PLLC; Norman S. Kinsella

(57) ABSTRACT

In general, the present disclosure is directed to a thermoelectric cooler (TEC) that includes a top plate or bottom plate being formed of a high thermal conductivity material, and the other of the top plate and bottom plate being formed of a low thermal conductivity material, with the high thermal conductivity material having a thermal conductivity at least twice, and preferably five times, that of the thermal conductivity of the low thermal conductivity material. This disparity in thermal conductivity between the top plate and bottom plate materials may be referred to herein as asymmetric thermal performance.

16 Claims, 9 Drawing Sheets

— THERMOELECTRIC COOLER (TEC) HAVING TOP AND BOTTOM PLATES WITH ASYMMETRIC THERMAL CONDUCTIVITY AND AN OPTICAL SUBASSEMBLY IMPLEMENTING THE SAME

TECHNICAL FIELD

The present disclosure relates to optical communications and more particularly, to a thermoelectric cooler having face elements with asymmetric thermal performance and an optical subassembly implementing the same.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers. In general, ROSAs include a demultiplexer and one or more lenses to separate received channel wavelengths and convert the same into proportional electrical signals. Some applications requiring relatively long transmission distances can include a TOSA with a thermal management device such as thermoelectric cooler (TEC) to monitor channel wavelengths and heat/cool lasers to stabilize wavelengths and mitigate drift. TECs can include Peltier elements sandwiched between two ceramic plates/faces. Such TECs are generally designed with materials that provide a sufficient amount of thermal transfer to ensure wavelength stabilization.

BRIEF DESCRIPTION OF THE DRAWINGS

These and other features and advantages will be better understood by reading the following detailed description, taken together with the drawings wherein.

DETAILED DESCRIPTION

Figure 1A:
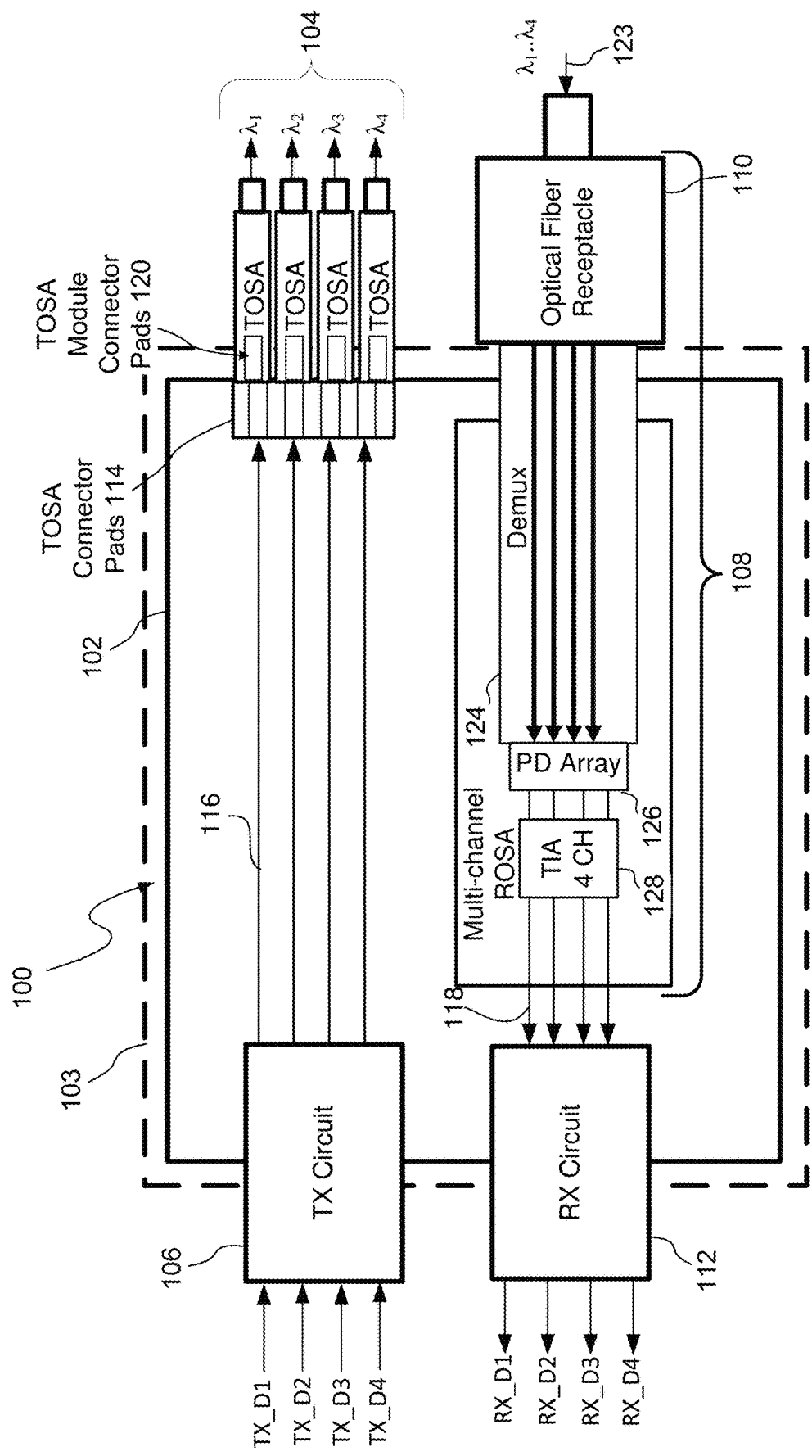
FIG. 1A is a block diagram of a multi-channel optical transceiver, consistent with embodiments of the present disclosure.

As discussed above, some optical transmission systems send and receive channel wavelengths over relatively long transmission distances, e.g., up to 2 km and beyond. The optical signal quality over such long distances therefore becomes important in order to maintain nominal performance. One approach to maintaining optical signal quality includes temperature control devices, e.g., thermoelectric coolers (TECs), in thermal communication with laser diodes (LDs) within transmitters/transceivers to maintain a nominal operating temperature and minimize or otherwise reduce wavelength drift. However, such temperature control devices are often limited in thermal performance relative to the materials used to form the same.

For instance, some TECs use Alumina for both top and bottom plates, and as a result, such TECs are capable of thermal conductivity of about 40 Watts per meter Kelvin (W/mK), e.g., at room temperature. On the other hand, Aluminum Nitride (AlN) provides thermal conductivity of about 180 W/mK or more in similar conditions. While such materials with high thermal conductivity significantly increase thermal performance, the relative increased cost of the materials significantly increases manufacturing costs. Accordingly, temperature control devices generally utilize relatively less-expensive, low thermal conductivity materials with the temperature regulation of LDs being accommodated in part by transmitter/transceiver designs which implement mitigating techniques to reduce load on temperature control devices. Some such example configurations include isolating LDs away from associated components by disposing the LDs on dedicated submount(s), increasing heatsink dimensions, and providing relatively direct thermal conduction between heat-generating components and an associated housing. These mitigating techniques can assist in maintaining the temperature of LDs within a nominal operating range, but also decrease design flexibility and can necessitate including additional components in already space-constrained housings. Continued scaling and improvements in thermal performance of temperature control devices therefore depends at least in part on the development of temperature control devices that achieve relatively high thermal performance while still being manufactured in substantial part using highly-available, low-cost, low thermal conductivity materials, such as Alumina.

Thus, in accordance with an embodiment, a thermoelectric cooler (TEC) is disclosed herein that includes a top plate or bottom plate being formed of a high thermal conductivity material, and the other of the top and bottom plate being formed of a low thermal conductivity material, with the high thermal conductivity material having a thermal conductivity at least twice, and preferably at least five times, that of the thermal conductivity of the low thermal conductivity material. In accordance with another embodiment, the top plate is formed of a low thermal conductivity material and the bottom plate is formed of a high thermal conductivity material. As discussed in further detail below, either the top or bottom plate may be formed of the high thermal conductivity material to advantageously accommodate a range of operating conditions. In any event, this difference in thermal conductivity of the resulting plates of a TEC may be referred to as plates with asymmetrical thermal performance.

In more detail, a temperature control device consistent with the present disclosure is implemented as a thermoelectric cooler (TEC) having a first plate (or a bottom plate), a second plate (a top plate), and a plurality of semiconductor elements, e.g., Peltier elements, disposed between the first and second plates. The top plate of the TEC provides at least one mounting surface for supporting optical components, e.g., an LD and associated circuitry, and the bottom plate of the TEC provides at least one mating surface to couple to a heatsink, such as the sidewall of the housing. The semiconductor elements adjustably facilitate thermal communication between the first and second plates, e.g., based on an applied electrical current, and provides at least one thermal conduction path between the at least one mounting surface and the heatsink.

In one embodiment, the top plate of the temperature control device is formed with at least 50%, and preferably 90-100%, of the overall weight of the top plate being a high thermal conductivity material (not including impurities). On the other hand, the bottom plate is formed with at least 50%, and preferably 90-100%, of the overall weight of the bottom plate being a low thermal conductivity material (not including impurities). In this embodiment, the high thermal conductivity material of the top plate has a thermal conductivity that it is at least twice the thermal conductivity of the low thermal conductivity of the bottom plate. This disclosure has identified that having the relatively higher thermal conductivity material in the top plate of a temperature control device facilitates thermal performance similar to that of a TEC with both top and bottom plates being formed of a high thermal conductivity material, e.g., at least 80 Watts per meter Kelvin (W/mK) at room temperature.

In addition, this disclosure has identified having a bottom plate formed of a relatively low thermal conductivity material, e.g., Aluminum Oxide (Al2O3), advantageously allows for matching of thermal expansion coefficients (CTEs) between the bottom plate and the heatsink/supporting structure. For instance, consider a scenario wherein an optical subassembly housing is formed of copper tungsten (CuW) which has a CTE of about 6.5 to 8.5 parts per million per degree Celsius (ppm/° C.), and the bottom plate of the temperature control device (that is mounted to and supported by the optical subassembly housing) is formed of Aluminum Oxide (Al2O3) which has a CTE of about 8.1 ppm/° C. In this scenario the CTE between the optical subassembly housing and the bottom plate of the temperature control device is "matched" such that the difference is less than about 2 ppm/° C. In contrast, if the bottom and top plates of the temperature control device were both formed of a high-thermal conductivity material, such as Aluminum Nitride (AlN), then the resulting CTE would equal about 4.5 ppm/° C. Accordingly, such a temperature control device would have a CTE mismatch with an optical subassembly housing formed of CuW, with the resulting difference being 2.0 ppm in a best-case scenario and up to about 4.0 in a worst-case scenario. Such a difference in CTE can result in stress at the interface between the temperature control device and the supporting structure, and can ultimately result in stress fractures and/or a misalignment in optical light paths which can result in power loss. Thus, the present disclosure has identified that a temperature control device consistent with the present disclosure can increase thermal conductivity with optical components coupled thereto, e.g., by having a top plate formed of a high thermal conductivity material, and achieve a wide-range of operating temperatures without such power losses by having a bottom plate with a CTE that substantially matches materials commonly utilized to provide housings/heatsinks such as Copper Tungsten.

In one embodiment, the bottom plate of the temperature control device is formed with at least 50%, and preferably 90-100%, of the overall weight of the bottom plate being a high thermal conductivity material (not including impurities). On the other hand, the top plate is formed with at least 50%, and preferably 90-100%, of the overall weight of the top plate being a low thermal conductivity material (not including impurities). In this embodiment, the high thermal conductivity material of the bottom plate has a thermal conductivity that it is at least twice the thermal conductivity of the low thermal conductivity of the top plate. This disclosure has identified that having the relatively lower thermal conductivity material in the top plate of the temperature control device can act as a thermal insulator to maintain a target LD temperature. This disclosure has identified that the top plate acting as a thermal insulator, rather than a heat sink, can advantageously maintain the temperature of an LD in relatively cold environments, e.g., where the ambient temperature is −5 Celsius and below.

Accordingly, a TEC consistent with the present disclosure provides numerous advantages over other temperature control approaches. For example, the thermal load of the TEC may be increased, e.g., more components can be disposed thereon, by having a top plate formed of a material having high thermal conductivity, thus allowing for greater flexibility when designing optical transceivers/transmitters. This flexibility further allows for components to be closer together (e.g., co-located on a submount) or otherwise disposed in a configuration that accommodates space-constrained housings. In addition, the overall cost to manufacture each TEC, and thus by extension, the overall cost of the optical transceiver/transmitter may be significantly reduced.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Referring to the Figures, FIG. 1A illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 transmits and receives four (4) channels using four different channel wavelengths (λ1, λ2, λ3, λ4) and may be capable of transmission rates of at least about 25 Gbps per channel. In one example, the channel wavelengths λ1, λ2, λ3, λ4 may be 1270 nm, 1290 nm, 1310 nm, and 1330 nm, respectively. Other channel wavelengths are within the scope of this disclosure including those associated with local area network (LAN) wavelength division multiplexing (WDM). The optical transceiver 100 may also be capable of transmission distances of 2 km to at least about 10 km. The optical transceiver 100 may be used, for example, in internet data center applications or fiber to the home (FTTH) applications.

In an embodiment, the optical transceiver module 100 is disposed in a transceiver housing 103 or cage. The transceiver housing 103 can be configured with one or more cavities to receive and removably couple to one or more optical transceiver modules, such as N number of pluggable small form-factor (SFF) modules, depending on a desired configuration.

The optical transceiver module 100 may include a number of components to support transceiver operations. The optical transceiver module 100 may include an optical transceiver substrate 102, a plurality of transmitter optical subassemblies (TOSA) modules 104 for transmitting optical signals on different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA, and a receiver connecting circuit 112.

The optical transceiver substrate 102 includes traces, connector pads, and other circuitry to support transceiver operations. The optical transceiver substrate 102 may include TOSA connector pads 114 (or terminals 114) that enable each of the TOSA modules 104 to mount and electrically couple to the optical transceiver substrate 102. The optical transceiver substrate 102 may include traces 116 that couple the TOSA connector pads 114 to the transmit connecting circuit 106. The optical transceiver substrate 102 may include traces 118 that electrically couple the ROSA arrangement 108 to the receiver connecting circuit 112. The optical transceiver substrate 102 may be manufactured from a multi-layer printed circuitry board (PCB), although other types of substrates may be utilized and are within the scope of this disclosure.

Each of the TOSA modules 104 may be configured to receive driving electrical signals (TX_D1 to TX_D4), convert the electrical signals to a multiplexed optical signal (e.g., a signal with channel wavelengths λ1 ... λn) and output the same to a multiplexer (not shown). Each of the TOSA modules 104 may be electrically coupled to the TOSA connector pads 114 and to the traces 116 through TOSA module connector pads 120. Each of the TOSA modules 104 may include a laser diode device and supporting components and circuitry such as focus lens, optical isolator and thermoelectric cooler (TEC). As discussed in greater detail below, each of the TOSA modules 104 can include a TEC (not shown in FIG. 1A) having top and bottom plates comprising different materials having substantially different (or asymmetric) thermal conductivity to increase or decrease thermal communication between the laser diode and a heatsink, e.g., the TOSA housing. The laser diode devices of the TOSA modules 104 may include distributed feedback lasers (DFBs), electro-absorption modulated lasers (EMLs), vertical external-cavity surface-emitting lasers (VECSEL) or other suitable laser devices.

As further in shown FIG. 1A, the multi-channel ROSA arrangement 108 includes an optical demultiplexer 124, a photodetector array 126 (e.g., photodiodes), and a transimpedance amplifier (TIA) 128 or amplification circuit 128 for amplifying and converting optical signals into electrical signals.

In operation, the optical demultiplexer 124 receives the optical signal from the receive optical fiber 123 and then provides separated channel wavelengths from the same to the array of photodiodes 126. In turn, the array of photodiodes 126 converts the received channel wavelengths into an electrical signal and provides the same to the TIA 128. The TIA then amplifies and provides the receiver connecting circuit 112 with electrical signals (RX_D1 to RX_D4) corresponding to the received channel wavelengths. The receiver connecting circuit 112 is electrically connected to the electronic components (e.g., the laser, monitor photodiode, etc.) in the ROSA 108. The receiver connecting circuit 112 can include conductive paths to provide electrical connections and may also include additional circuitry.

Figure 1B:
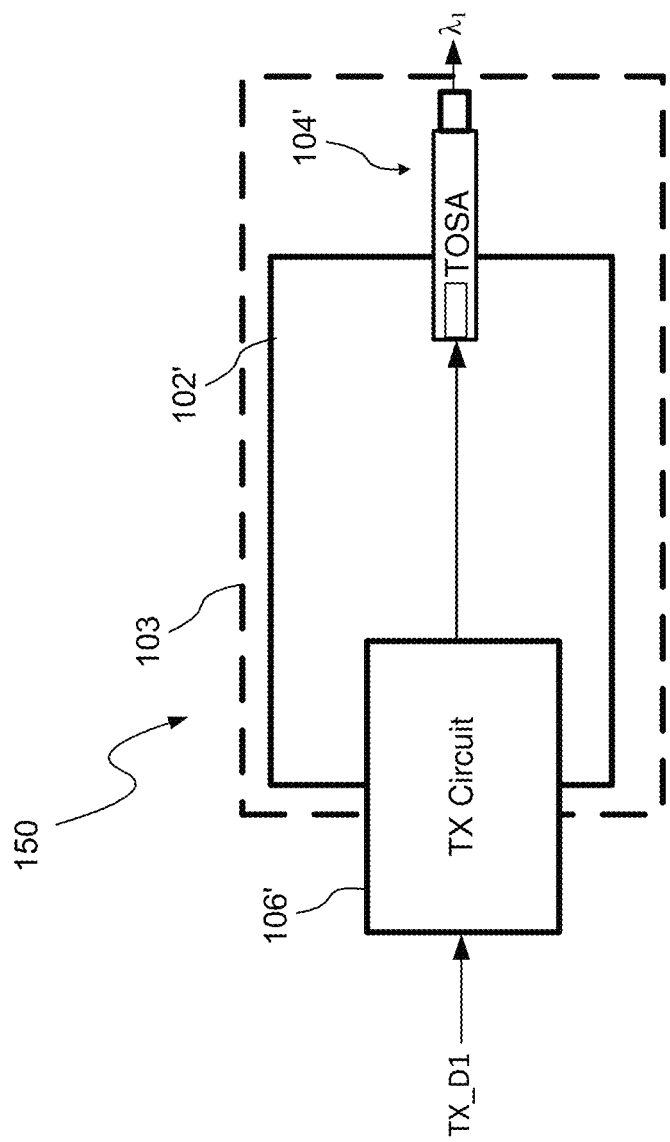
FIG. 1B is a block diagram of an optical transmitter module, consistent with embodiments of the present disclosure.

FIG. 1B shows an example optical transmitter module 150 consistent with an embodiment of the present disclosure. As shown, the optical transmitter module 150 includes a transmit connecting circuit 106' and TOSA 104' coupled to a substrate 102'. The optical transmitter module 150 may be removably coupled into, for instance, a cage 103. The transmit connecting circuit 106' can provide an electrical signal (TX_D1) to modulate the TOSA 104' and cause the same to emit an associated channel wavelength (λ1). As discussed in greater detail below, the TOSA module 104' can include a TEC (not shown in FIG. 1B) having top and bottom plates comprising different materials having substantially different (or asymmetric) thermal conductivity.

Figure 2:
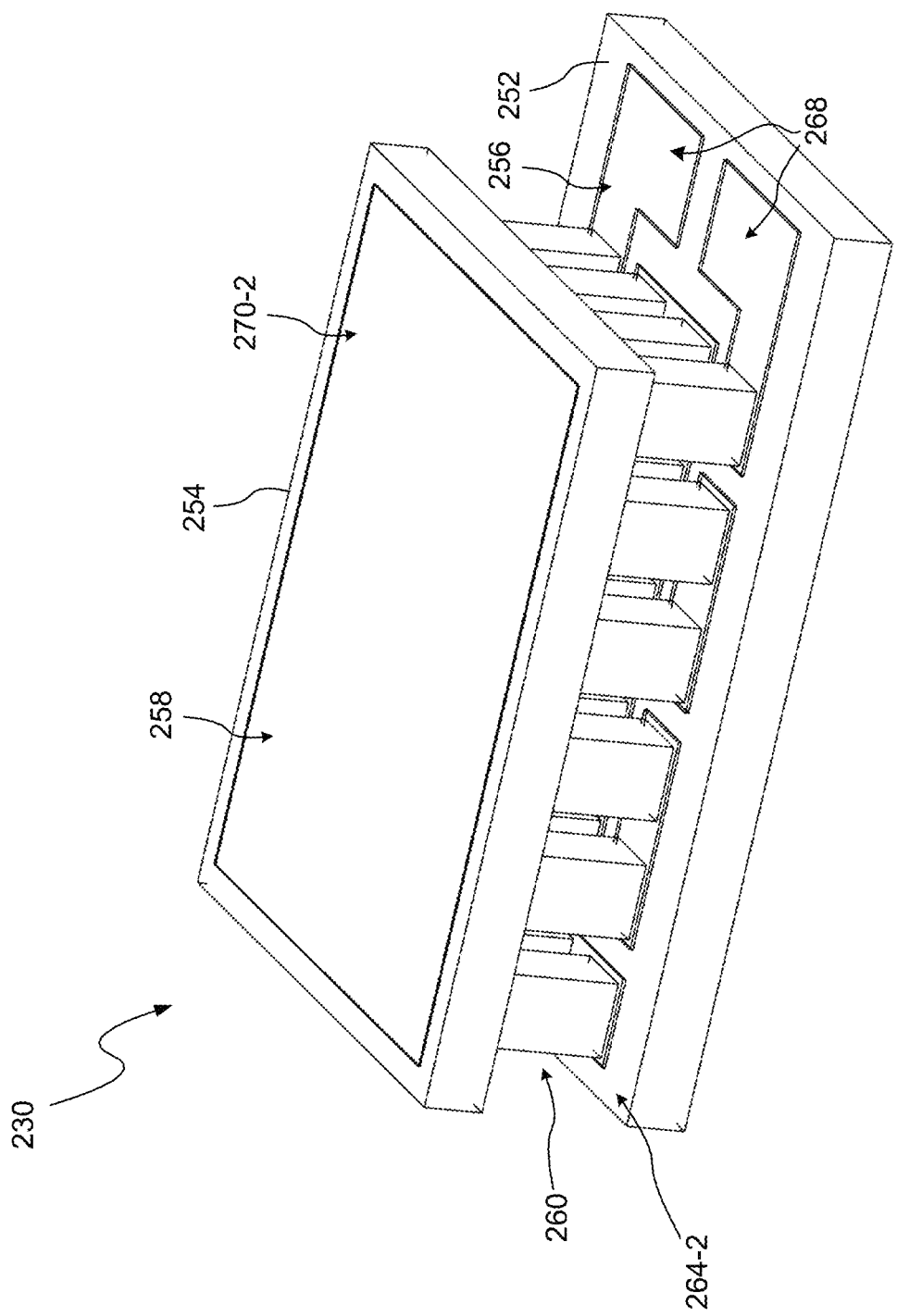
FIG. 2 is a perspective view of an example thermoelectric cooling device suitable for use in the multi-channel optical transceiver of FIG. 1A or the optical transmitter module of FIG. 1B, in accordance with embodiments of the present disclosure.
Figure 3:
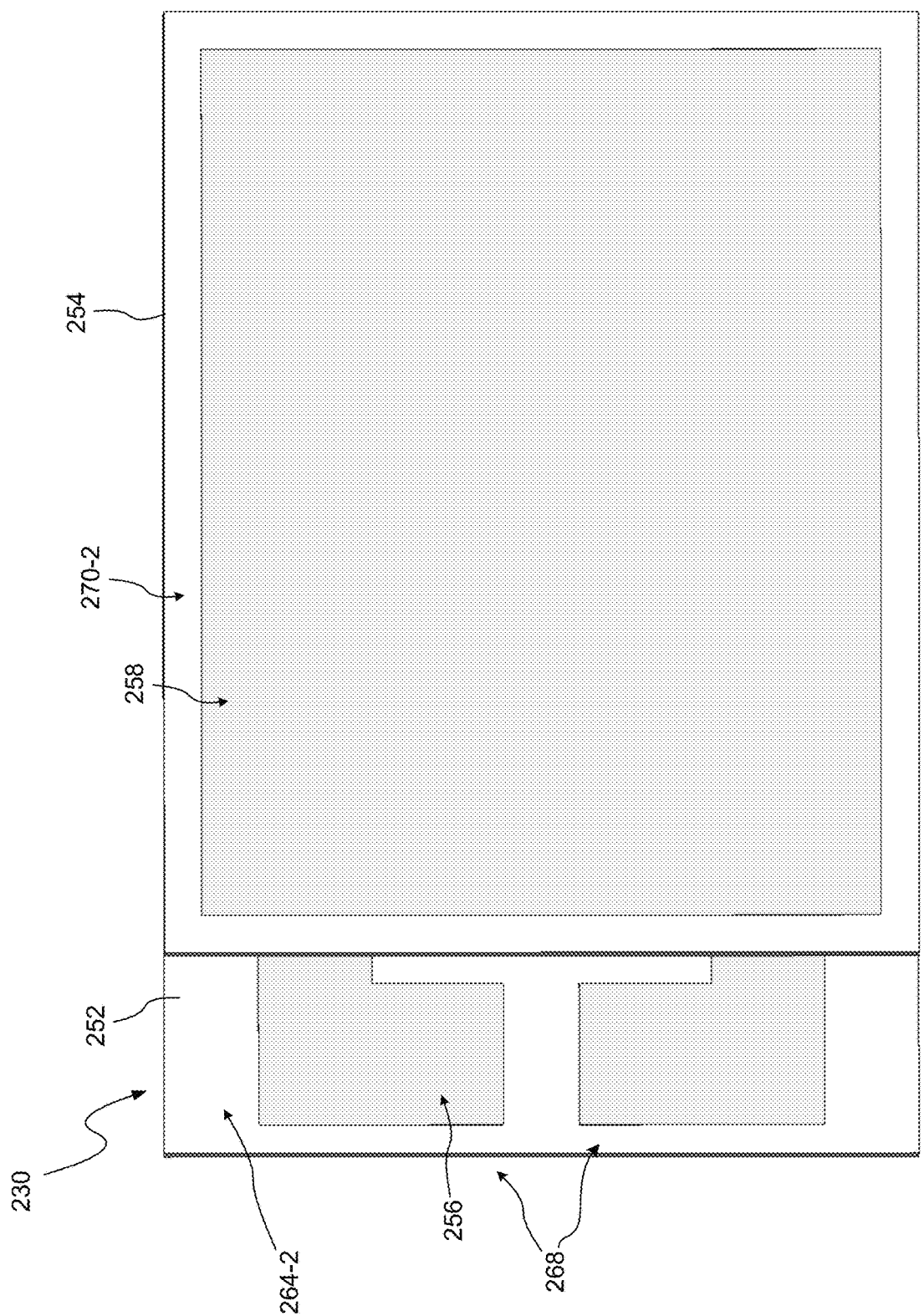
FIG. 3 shows a top-down view of the example thermoelectric cooling device of FIG. 2, in accordance with an embodiment.
Figure 4:
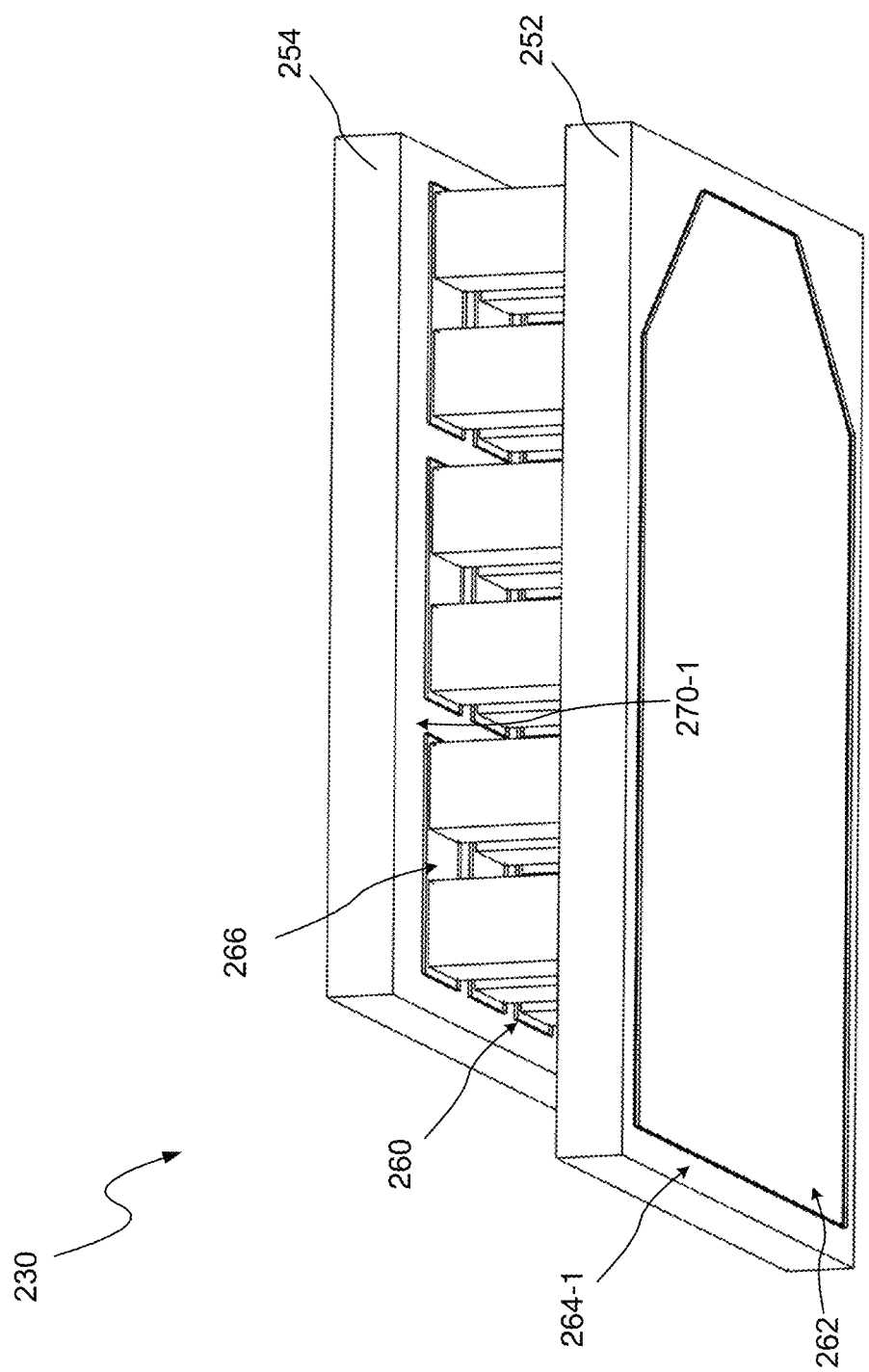
FIG. 4 is another perspective view of the example thermoelectric cooling device of FIG. 2, in accordance with an embodiment.
Figure 5:
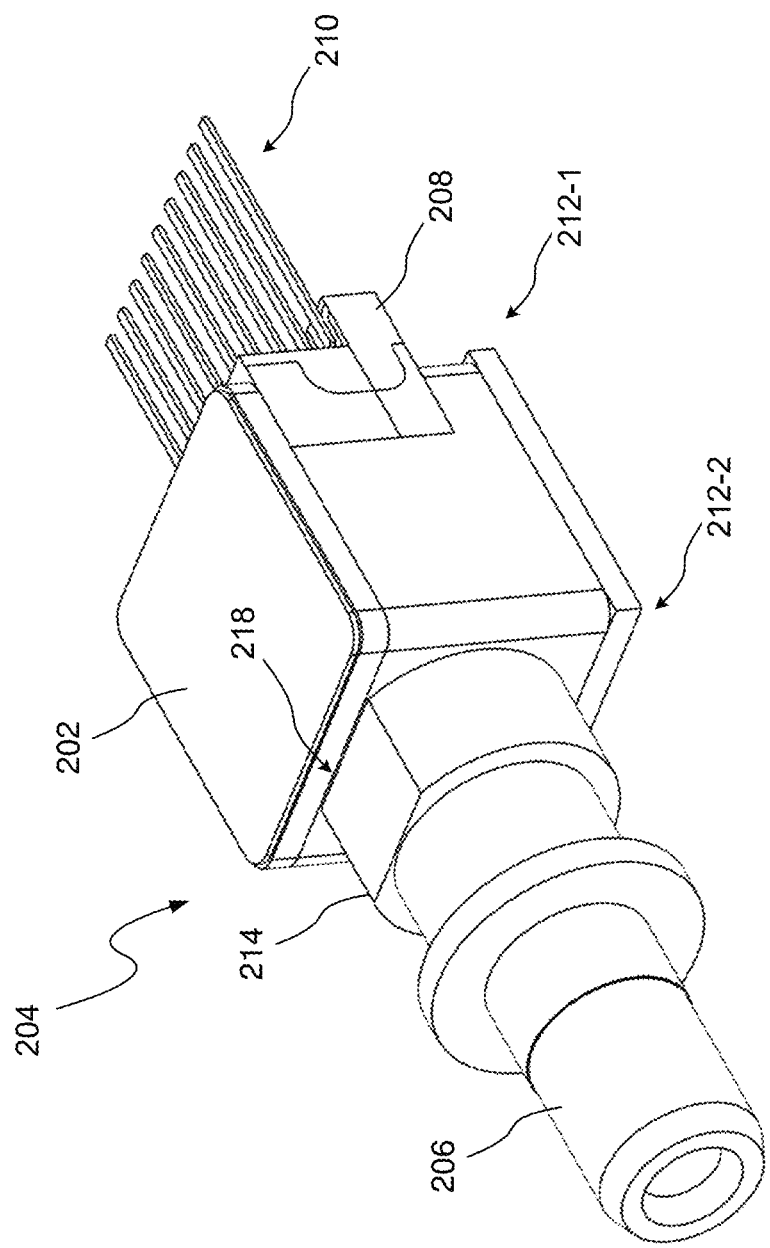
FIG. 5 shows a perspective view of an example transmitter module, in accordance with an embodiment of the present disclosure.
Figure 6:
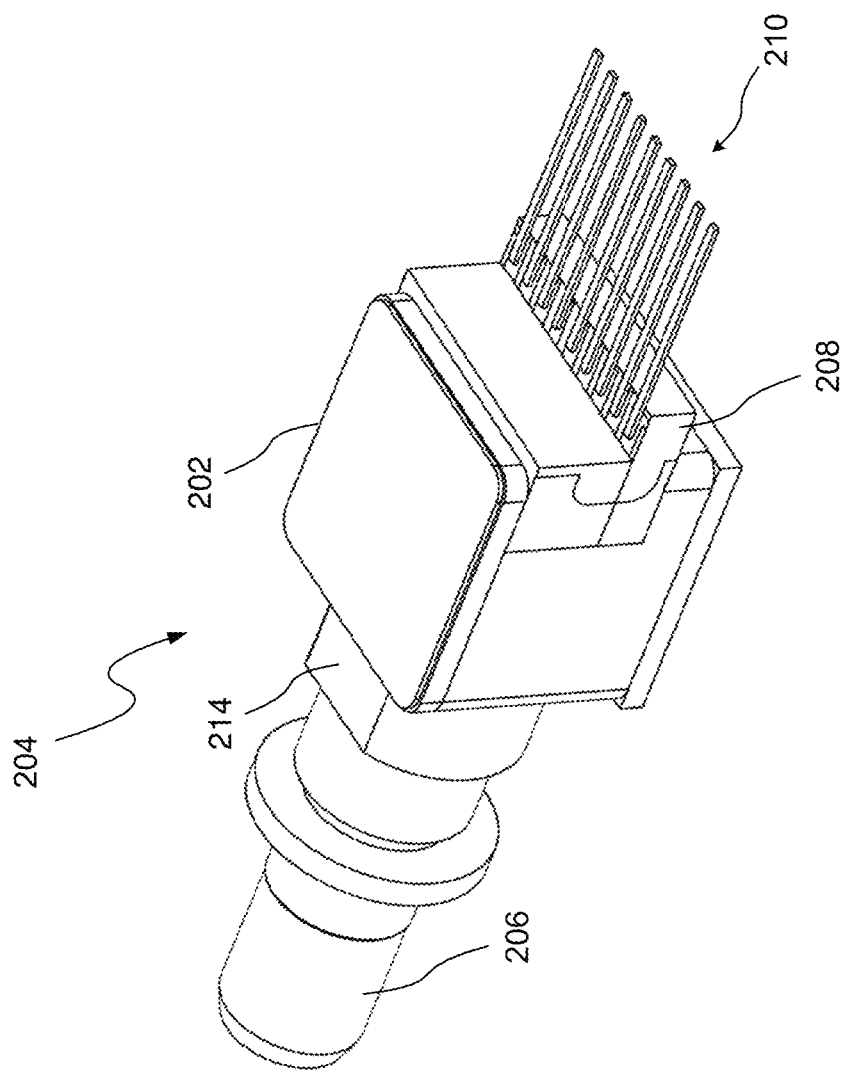
FIG. 6 shows another perspective view of the example transmitter module of FIG. 5, in accordance with an embodiment of the present disclosure.

Referring to FIGS. 2-4, an example thermoelectric cooler (TEC) 230 is shown consistent with embodiments of the present disclosure. As shown, the TEC 230 includes a bottom plate 252 (or first plate 252), a plurality of semiconductor elements (or devices) 260, and a top plate 254 (or second plate 254). The bottom plate 252 couples to a heatsink and the top plate 254 couples to and supports a laser arrangement, as discussed further below. In embodiments, the bottom plate 252 comprises a first material and the top plate 254 comprises a second material, wherein the first and second materials differ from one another. In particular, the first and second materials have different respective thermal conductivities. In specific examples, the thermal conductivity of one of the first and second material is at least twice that of the other of the first and second material. For example, the material having the relatively higher thermal conductivity may be at least five times greater than the thermal conductivity of the other material. For purpose of clarity the first and second materials may also be referred to as low and high conductivity materials, respectively. As used herein, the term "thermal conductivity" when used in conjunction with a material refers to thermal conductivity of the material at room temperature.

The first and second materials may be formed from or include any suitable materials. For example, the first and second materials may each be formed from or include one or more metals, ceramics, composites, combinations thereof, and the like. Without limitation, in embodiments the first material includes, or is, in the form of a material having a first thermal conductivity and the second material includes, or is, in the form of a material having a second thermal conductivity, wherein the second thermal conductivity is greater than the first thermal conductivity. For example, the second thermal conductivity may be at least about 2, 3, 4, 5 or even about 6 or more times greater than the first thermal conductivity. Put differently, the first material (of the bottom plate) may be in the form of, or include, one or more "low" thermal conductivity materials, and the second material (of the top plate) may be in the form of, or include, one or more "high" thermal conductivity materials, wherein the thermal conductivity of the low and high materials meets the aforementioned relationship. Without limitation, in embodiments the top plate is formed from or includes a high thermal conductivity material and the bottom plate is formed from, or includes, a low thermal conductivity material, wherein the thermal conductivity of the high the high thermal conductivity material is about 5 to about 6 times greater than the thermal conductivity of the low thermal conductivity material.

In embodiments the low thermal conductivity material has a thermal conductivity in the range of greater than 0 to about 50 Watts per meter Kelvin (W/mK), such as from about 10 to about 40 W/mK, or even from about 20 to about 40 W/mK. Non-limiting examples of suitable low thermal conductivity materials that may be used include alumina ($Al_2O_3$—also known as Alumina Oxide—thermal conductivity in the range of about 20 to about 30 W/mK), combinations thereof and the like. In some embodiments, the low thermal conductivity material is formed from or includes Alumina.

In contrast, the high thermal conductivity material may have a thermal conductivity in range of greater than or equal to about 70 W/mK, such as greater than about 100 W/mK, about 120 W/mK, about 140 W/mK, about 160 W/mK, about 180 W/mK, or even about 200 W/mK or more. Non-limiting examples of suitable high thermal conductivity materials that may be used include Aluminum Nitride (AlN—thermal conductivity of about 180 W/mK), Beryllium Oxide (BeO—room temperature thermal conductivity of about 285 W/mK).

In any such cases, the high and low conductivity material may be formed of any suitable metal, ceramic, composite, ceramic, or combination thereof so long as the high conductivity material has an associated thermal conductivity that is at least twice that of the low thermal conductivity material, and preferably, an associated thermal conductivity that is at least 5-6 times greater than that of the low thermal conductivity material. Accordingly, the bottom and top plates 252, 254 have asymmetric thermal performance/conductivity relative to each other.

In an embodiment, the bottom plate 252 is formed from a first material, wherein the first material includes from about 80 to about 99% of Alumina or Aluminum Nitride, relative to the total weight of the first material), and from about 1 to about 20% of other materials, such as one or more matrix/binder materials, impurities, or the like. The remainder of material of the bottom plate 252 can include any suitable material including impurities. In embodiments, bottom plate 252 is formed from a first material that includes from about 90 to about 99 weight % of Alumina and/or Aluminum Nitride, and from about 1 to about 10 weight percent other materials, such as one or more matrix/binder materials, impurities, or the like. In specific non-limiting embodiments, bottom plate 252 is formed from a first material that includes from 90 to 99% by weight of Aluminum Nitride, relative to the total weight of the first material.

In an embodiment, the top plate 254 is formed from a second material, wherein the second material includes from about 80 to about 99% of Alumina or Aluminum Nitride, relative to the total weight of the first material, and from about 1 to about 20% of other materials, such as one or more matrix/binder materials, impurities, or the like. The remainder of material of the top plate 254 can include any suitable material including impurities. In embodiments, the top plate 254 is formed from a second material that includes from about 90 to about 99 weight % Aluminum Nitride, and from about 1 to about 10 weight percent other materials, such as one or more matrix/binder materials, impurities, or the like. In specific non-limiting embodiments, top plate 254 is formed from a second material that includes from 90 to 99% by weight of Aluminum Nitride, relative to the total weight of the first material.

This disclosure has identified that having a top plate with high thermal conductivity and a bottom plate with a substantially lower thermal conductivity can sufficiently cool a laser assembly supported by the top plate. In one specific example, a TEC consistent with this embodiment has achieved temperature reductions of up to about 25 degree Celsius relative to the ambient temperature. This advantageously allows for a TEC consistent with the present disclosure to be constructed with one plate (e.g., the top plate) being formed from a more expensive, higher-thermal conducting material and the other plate (e.g., the bottom plate) to be formed from a relatively inexpensive material that has substantially less thermal performance.

Thus, in an embodiment, the bottom plate 252 is formed of a material having thermal conductivity that is at least twice, and preferably, at least five times of that of the thermal conductivity of the material forming the top plate 254. For example, in an embodiment, the top plate 254 is formed of a ceramic having 80-99 wt. % Alumina of the overall weight of the top plate 254, and preferably 90-99 wt. % Alumina of the overall weight of the top plate 254. In any such cases, the remainder of material of the top plate 254 can include any suitable material including impurities. In some cases, the top plate 254 is formed of a ceramic having 99-100 wt. % Alumina, including impurities. In this embodiment, the bottom plate 252 is a ceramic having 80-99 wt. % Aluminum Nitride of the overall weight of the bottom plate 252, and preferably 90-99 wt. % Aluminum Nitride of the overall weight of the bottom plate 252. Accordingly, this embodiment includes the base plate 252 that couples to the heat sink having a thermal conductivity that is three-times, and preferably, about six times the thermal conductivity of that of the top plate that couples to and supports the laser arrangement. Accordingly, this embodiment is particularly well suited for environments that are relatively cold, e.g., −5 degrees Celsius, with the reduced thermal conductivity of the top plate 254 acting as essentially thermal insulation to selectively keep heat generated by the associated laser arrangement from dissipating and ensuring that the associated laser to remains within a nominal operating temperature.

In any such cases, the bottom plate 252 is defined by a first substantially planer mounting surface 264-1 (See FIG. 4) disposed opposite a second substantially planer mounting surface 264-2. The first and second substantially planer mounting surfaces 264-1, 264-2 extend substantially parallel with each other, as shown, although other embodiments are within the scope of this disclosure. The first mounting surface 264-1 of the bottom plate 252 provides at least one mating face for thermally coupling with a heatsink, such as the sidewall of a TOSA housing. The first mounting surface 264-1 optionally includes a pad 262 disposed/formed thereon. The pad 262 may be formed via a metallization process and can comprise, for example, gold (Au) or other metal/metal alloy that provides a surface suitable for fixation to the heat sink via welding or soldering, for instance. The material of the pad 262 may be chosen based on a material having thermal conductivity that substantially matches that of the material forming the bottom plate 252.

Continuing on, the second mounting surface 264-2 includes a first plurality of traces 256 disposed thereon. The first plurality of traces 256 couple to and support the plurality of semiconductor elements 260, and importantly, provide an electrical junction therebetween to TEC 230 to thermally conduct according to the Peltier effect, as will be discussed in further detail below. The first plurality of traces 256 may comprise, for example, Gold (Au) or any other suitable metal/metal alloy.

As further shown, the top plate 254 is defined by a first substantially planer mounting surface 270-1 (See FIG. 4) disposed opposite a second substantially planer mounting surface 270-2 (FIG. 3). The first and second substantially planer mounting surfaces 270-1, 270-2 extend substantially parallel with each other, as shown, although other embodiments are within the scope of this disclosure. The first substantially planer mounting surface 270-1 includes a plurality of pads/terminals 266 disposed thereon. The plurality of pads/terminals 266 may comprise, for example, Gold (Au) although other metals and metal alloys are within the scope of this disclosure. The plurality of pads/terminals 266 allow the first substantially planer mounting surface 270-1 to couple to a second end of each of the plurality of semiconductor devices 260.

The plurality of semiconductor devices 260 coupled between the first and second plates 252, 254 can include a plurality of alternating P- and N-type Peltier devices. The plurality of semiconductor devices 260 can couple electrically in series and thermally in parallel.

The second mounting surface 270-2 provides one or more mounting surfaces for supporting a laser assembly (not shown), with the laser assembly including at least a laser diode and supporting circuitry. As shown, a pad 258 is disposed/formed on the second mounting surface 270-2. The pad 258 may comprise, for instance, Gold (Au) or other suitable metal or metal alloy. The laser diode and associated circuitry of the laser assembly can couple (e.g., directly or indirectly via a submount) to the pad 258 and be supported by the same. Thus, the laser diode and associated circuitry can be in thermal communication with the TEC by way of the pad 258.

As further shown, at least two leads/terminals 268 are formed by the first plurality of traces 256. The terminals 268 allow for the TEC 230 to be electrically coupled to, for instance, a temperature control system (not shown) and power source. During operation, current may be therefore induced into the TEC 230 by way of the terminals 268 to cause the TEC 230 to increase or decrease temperature, as the case may be. The terminals 268 may be exposed such that the top plate 254 does not extend over the same, e.g., based on the first and second plates 252, 254 not being coextensive with each other.

Turning to FIGS. 5-8, an example transmitter optical subassembly module (TOSA) 204 is shown consistent with embodiments of the present disclosure. The TOSA module 204 is suitable for use in an optical transceiver system of FIG. 1A or optical transmitter such as the optical transmitter module of FIG. 1B. The TOSA module 204 includes a housing 202 and an optical coupling receptacle 206.

Figure 8:
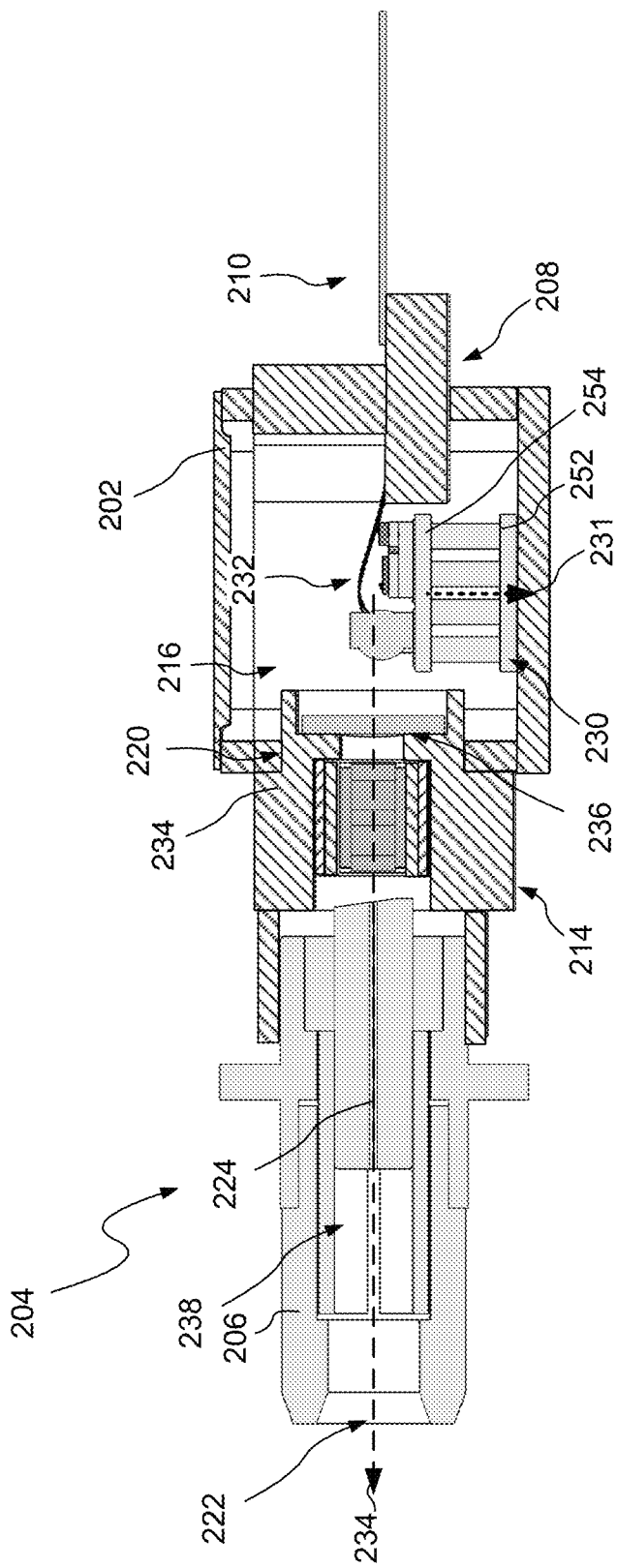
FIG. 8 shows a cross-sectional view of the example transmitter module of FIG. 7 taken along line 8-8, in accordance with an embodiment of the present disclosure.

In particular, the housing 202 includes a plurality of sidewalls that define a cavity 216 (See FIG. 8). The cavity may be hermetically-sealed, and thus, the example TOSA module 204 may also be referred to as a hermetically-sealed TOSA module or a hermetically-sealed light engine. However, other embodiments are within the scope of this disclosure and the cavity 216 may not necessarily be hermetically-sealed.

A first end 212-1 of the housing includes a feedthrough device 208 and a plurality of electrical leads/pins 210. The electrical leads/pins 210 can electrically couple to, for instance, the TOSA connecting pads 114 of the optical transceiver shown in FIG. 1A. The feedthrough device 208 thus provides electrical connectivity to provide power and radio frequency (RF) driving signals, e.g., from the transmit connecting circuit 106, to the optical components within the cavity 216 of the housing 202. A second end 212-2 of the housing 202, opposite the first end 212-1, includes a mounting region/receptacle for coupling to and securely holding the optical coupling receptacle 206 a predetermined position. The second end 212-2 includes an aperture 220 (see FIG. 8) to allow for optical components of the TOSA module 204 to optically couple to the optical coupling receptacle to launch channel wavelengths onto an external transmit fiber, for example. Accordingly, the first end 212-1 may therefore be referred to as an electrical coupling end and the second end 212-2 may be referred to as an optical coupling end.

The housing 202 may comprise, for example, a metal or metal alloy. In some cases, the housing 202 comprises a metal alloy comprising nickel, cobalt and iron commonly referred to as Kovar (e.g., ASTM F-15 alloy). Other metal and metal alloys are within the scope of this disclosure including non-metal materials that are suitably rigid.

Figure 7:
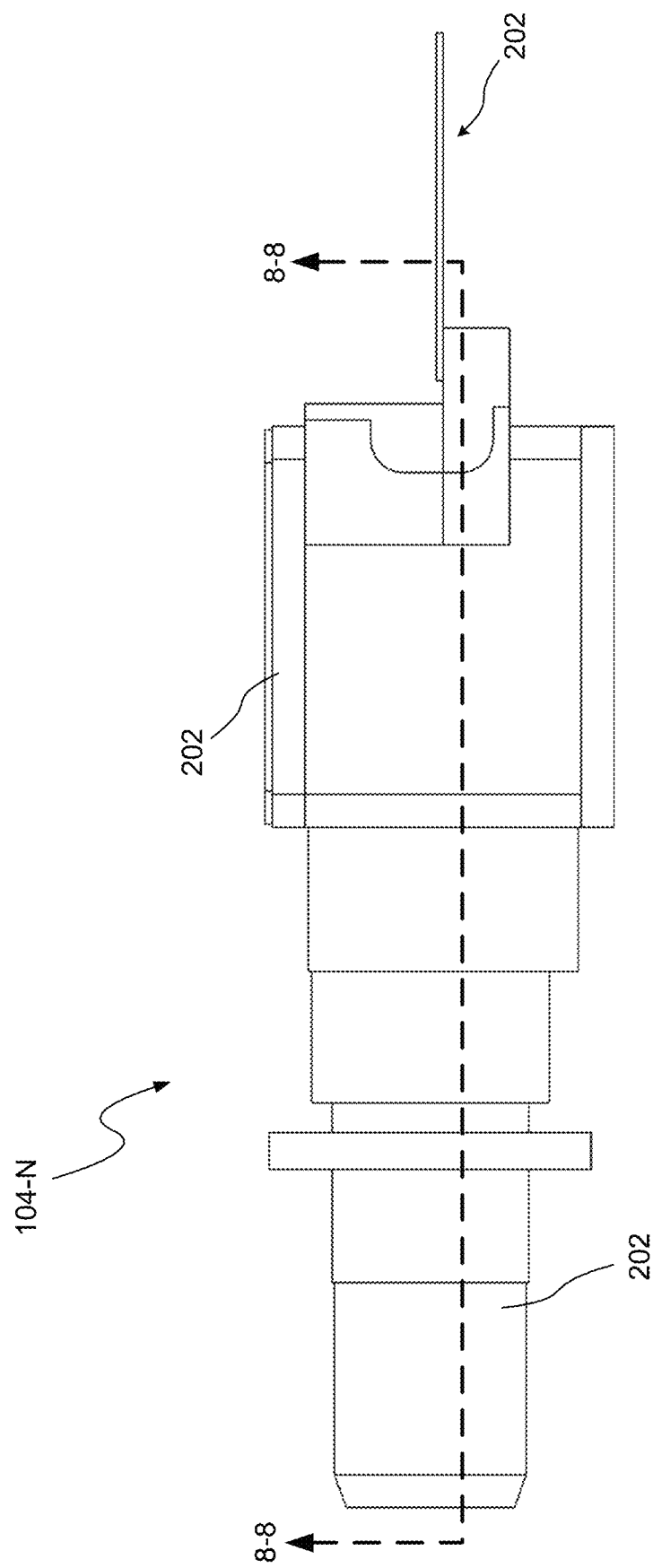
FIG. 7 shows a side view of the example transmitter module of FIG. 5, in accordance with an embodiment.

With specific reference to FIG. 8, a cross-sectional view of the example TOSA module 204 taken along line 8-8 of FIG. 7 is shown consistent with an embodiment of the present disclosure. As shown, the optical coupling receptacle 206 includes a first end with an opening/receptacle 222 to couple to, for example, a ferrule. The opening 222 then transitions to a cavity 238 that extends along the longitudinal length of the optical coupling receptacle 206 to provide a light path 234 therethrough. The optical coupling receptacle 206 further includes a fiber stub 224 within the cavity 238 following the opening 222.

As shown in FIG. 8, the TOSA housing 202 further includes a TEC 230 and a laser arrangement 232 supported by the same. The laser arrangement 232 is configured to emit associated channel wavelengths along light path 234. The TEC 230 is supported by a sidewall of the TOSA housing 202, with the TOSA housing providing, in a general sense, a heat sink to dissipate heat generated by the laser arrangement. To this end, the laser arrangement 232 is disposed on the top plate 254, with heat generated by the laser arrangement 232 following a thermal path shown generally at 231.

As further shown, the optical coupling receptacle 206 mechanically couples to the housing 202 via a coupler 214 (or coupler portion) of the housing 202. Note, the coupler 214 may be accurately considered as forming a portion of the housing 202. However, in other embodiments the coupler 214 may be a component of the optical coupling receptacle 206 itself. The coupler 214 of the housing 202 includes a body 214 with a first end for coupling/mating with the receptacle 222 and a second end for coupling/mating to the housing 202. At least a portion of the coupler 214 extends into the cavity 216 of the housing 202 and securely hold a window lens 236 in optical alignment with other optical components within the cavity 216 of the housing 202.

In accordance with an aspect of the present disclosure a temperature control device is disclosed. The temperature control device comprising a first plate comprising a first material and at least one surface for coupling to a heatsink, a second plate comprising a second material and having at least one mounting surface for coupling to an optical component, a plurality of semiconductor elements disposed between the first and second plate to provide a thermal conduction path between the at least one mounting surface and the heatsink, and wherein a thermal conductivity of the first material of the first plate or the second material of the second plate is at least twice that of the thermal conductivity of the other of the first material of the first plate or second material of the second plate.

In accordance with another aspect of the present disclosure an optical transmitter subassembly (TOSA) module is disclosed. The TOSA module comprising a TOSA housing defining a cavity, a temperature control device disposed in the cavity, the temperature control device comprising a first plate comprising a first material and at least one surface for thermally coupling to the TOSA housing, a second plate comprising a second material and having at least one mounting surface for coupling to an optical component, a plurality of semiconductor elements disposed between the first and second plate to provide a thermal conduction path between the at least one mounting surface and the TOSA housing, and wherein a thermal conductivity of the first material of the first plate or the second material of the second plate is at least twice that of the thermal conductivity of the other of the first material of the first plate or second material of the second plate, a laser diode to emit an associated channel wavelength, the laser diode being supported by and mounted to the at least one mounting surface and in thermal communication with the thermal conduction path.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A temperature control device, the temperature control device comprising:
   a first plate comprising a first material and at least one surface for coupling to a heatsink;
   a second plate comprising a second material and having at least one mounting surface for coupling to an optical component;
   a plurality of semiconductor elements disposed between the first and second plate to provide a thermal conduction path between the at least one mounting surface and the heatsink; and
   wherein a thermal conductivity of the first material of the first plate or the second material of the second plate is at least twice that of the thermal conductivity of the other of the first material of the first plate or second material of the second plate.

2. The temperature control device of claim 1, wherein the first material of the first plate has a thermal conductivity that is at least two times greater than that of the second material of the second plate.

3. The temperature control device of claim 1, wherein the first material of the first plate has a thermal conductivity that is at least two times less than that of the second material of the second plate.

4. The temperature control device of claim 1, wherein the second plate is formed of ceramic having at least 80 wt % Aluminum Nitride.

5. The temperature control device of claim 1, wherein the first plate is formed of a ceramic having at least 80 wt % Aluminum Nitride.

6. The temperature control device of claim 1, wherein the thermal conductivity of the first plate is at least five times that of the thermal conductivity of the second plate.

7. The temperature control device of claim 1, wherein the thermal conductivity of the second plate is at least five times that of the thermal conductivity of the first plate.

8. The temperature control device of claim 1, wherein the plurality of semiconductor elements are Peltier elements.

9. The temperature control device of claim 1, further comprising a laser assembly, wherein the laser assembly includes a laser diode, and wherein the laser diode is mounted to and supported by the at least one mounting surface of the second plate to thermally couple the laser diode with the thermal conduction path.

10. An optical transmitter subassembly (TOSA) module, the TOSA module comprising:
    a TOSA housing defining a cavity;
    a temperature control device disposed in the cavity, the temperature control device comprising:
      a first plate comprising a first material and at least one surface for thermally coupling to the TOSA housing;
      a second plate comprising a second material and having at least one mounting surface for coupling to an optical component;
      a plurality of semiconductor elements disposed between the first and second plate to provide a thermal conduction path between the at least one mounting surface and the TOSA housing; and
      wherein a thermal conductivity of the first material of the first plate or the second material of the second plate is at least twice that of the thermal conductivity of the other of the first material of the first plate or second material of the second plate;
    a laser diode to emit an associated channel wavelength, the laser diode being supported by and mounted to the at least one mounting surface and in thermal communication with the thermal conduction path.

11. The TOSA module of claim 10, wherein the first material of the first plate has a thermal conductivity that is at least two times greater than a thermal conductivity of the second material of the second plate.

12. The TOSA module of claim 10, wherein the first material of the first plate has a thermal conductivity that is at least two times less a thermal conductivity of the second material of the second plate.

13. The TOSA module of claim 10, wherein the second plate is formed of ceramic having at least 80 wt % Aluminum Nitride.

14. The TOSA module of claim 10, wherein the first plate is formed of a ceramic having at least 80 wt % Aluminum Nitride.

15. The TOSA module of claim 10, wherein the thermal conductivity of the first plate is at least five times that of the thermal conductivity of the second plate.

16. The TOSA module of claim 10, wherein the first plate has a thermal expansion coefficient that is substantially equal to the thermal expansion coefficient of the TOSA housing.

* * * * *